(12) United States Patent
Wang

(10) Patent No.: US 7,970,485 B2
(45) Date of Patent: Jun. 28, 2011

(54) SYSTEMS AND METHODS FOR DETERMINING WIDTH/SPACE LIMITS FOR A MASK LAYOUT

(75) Inventor: Li-Ming Wang, Taoyuan (TW)

(73) Assignee: Winbond Electronics Corp., Hsinchu (TW)

( * ) Notice: Subject to any disclaimer, the term of this patent is extended or adjusted under 35 U.S.C. 154(b) by 129 days.

(21) Appl. No.: 12/469,138

(22) Filed: May 20, 2009

(65) Prior Publication Data

US 2009/0225295 A1     Sep. 10, 2009

Related U.S. Application Data

(62) Division of application No. 11/037,005, filed on Jan. 19, 2005, now Pat. No. 7,550,237.

(51) Int. Cl.
G06F 19/00 (2011.01)
G03F 1/00 (2006.01)
G03C 5/00 (2006.01)
G03B 27/00 (2006.01)
G03B 27/42 (2006.01)

(52) U.S. Cl. ............... 700/119; 430/5; 430/30; 355/18; 355/53

(58) Field of Classification Search .................. 700/119; 430/5, 30; 355/18, 53
See application file for complete search history.

(56) References Cited

U.S. PATENT DOCUMENTS

| | | | |
|---|---|---|---|
| 6,243,855 B1 * | 6/2001 | Kobayashi et al. | 716/53 |
| 6,677,089 B2 | 1/2004 | Ogino et al. | |
| 7,057,715 B2 | 6/2006 | Robinson | |
| 7,346,878 B1 * | 3/2008 | Cohen et al. | 716/11 |
| 2003/0177467 A1 * | 9/2003 | Ohnuma et al. | 716/19 |
| 2006/0095887 A1 | 5/2006 | Bigwood et al. | |
| 2006/0141365 A1 * | 6/2006 | Toyama et al. | 430/5 |

* cited by examiner

Primary Examiner — Ramesh B Patel
Assistant Examiner — Jason Lin
(74) Attorney, Agent, or Firm — Muncy, Geissler, Olds & Lowe, PLLC

(57) ABSTRACT

Systems for determining width/space limits for product mask layouts. A mask writer generates a first pattern on a test mask corresponding to a test mask layout. A lithography tool generates a second pattern on a wafer corresponding to a first pattern on a test mask by a lithography process using a preset exposure dose. A metrology tool measures widths of the first and second pattern. A controller determines a width/space limit for the product mask layout according to the width difference between the first and second pattern.

9 Claims, 7 Drawing Sheets

| polygon CD (nm) | neighboring non-polygon CD (nm) | wafer CD (nm) |
|---|---|---|
| 190 | 190 | 195.5 |
| 190 | 195 | 194.8 |
| 190 | 200 | 193.5 |
| 190 | 205 | 190.7 |
| 190 | 210 | 188 |
| 190 | 215 | 187.2 |
| 190 | 220 | 185.4 |
| 190 | 230 | 183 |
| 190 | 240 | 175 |
| 190 | 250 | 167.2 |
| 190 | 260 | 162.3 |
| 190 | 270 | 156 |
| 190 | 280 | 143.4 |
| 190 | 290 | PR bridging |
| 190 | 300 | PR bridging |

| polygon CD (nm) | neighboring non-polygon CD (nm) | wafer CD (nm) |
|---|---|---|
| 210 | 210 | 223.9 |
| 210 | 215 | 222.2 |
| 210 | 220 | 220 |
| 210 | 225 | 218.7 |
| 210 | 230 | 218.4 |
| 210 | 235 | 218.3 |
| 210 | 240 | 215.2 |
| 210 | 250 | 214.3 |
| 210 | 260 | 210.8 |
| 210 | 250 | 214.3 |
| 210 | 260 | 210.8 |
| 210 | 270 | 204.1 |
| 210 | 280 | 200.6 |
| 210 | 290 | 194.6 |
| 210 | 300 | 193.4 |
| 210 | 310 | 189.5 |
| 210 | 320 | 183.4 |
| 210 | 330 | 179.4 |
| 210 | 340 | 175.6 |
| 210 | 350 | 175.4 |
| 210 | 360 | 173.5 |
| 210 | 370 | 170.2 |
| 210 | 380 | 168.8 |
| 210 | 420 | 159.9 |
| 210 | 460 | 160.1 |
| 210 | 500 | PR bridging |
| 210 | 590 | 149.3 |
| 210 | 670 | 153.8 |
| 210 | 760 | 149.8 |
| 210 | 840 | 156.8 |
| 210 | 860 | 154 |
| 210 | 1060 | 153.6 |
| 210 | 1260 | 151.6 |
| 210 | 1680 | PR bridging |
| 210 | 4200 | PR bridging |

411    FIG. 4B    413    415

| polygon CD (nm) | neighboring non-polygon CD (nm) | wafer CD (nm) |
|---|---|---|
| 230 | 230 | 247.2 |
| 230 | 235 | 247.1 |
| 230 | 240 | 243.2 |
| 230 | 245 | 244.1 |
| 230 | 250 | 241.6 |
| 230 | 255 | 236.7 |
| 230 | 260 | 238.4 |
| 230 | 270 | 236.1 |
| 230 | 280 | 234 |
| 230 | 290 | 229.5 |
| 230 | 300 | 224.8 |
| 230 | 310 | 224.1 |
| 230 | 320 | 221.8 |
| 230 | 330 | 218.5 |
| 230 | 340 | 217.5 |
| 230 | 350 | 213.5 |
| 230 | 360 | 211.7 |
| 230 | 370 | 210.9 |
| 230 | 380 | 209.2 |
| 230 | 390 | 213.2 |
| 230 | 400 | 208.9 |
| 230 | 410 | 209.3 |
| 230 | 420 | 211 |
| 230 | 460 | 211.2 |
| 230 | 510 | 205.4 |
| 230 | 550 | 207.3 |
| 230 | 640 | 203.5 |

FIG. 4C-1

SYSTEMS AND METHODS FOR DETERMINING WIDTH/SPACE LIMITS FOR A MASK LAYOUT

CROSS REFERENCE TO RELATED APPLICATION

This application is a Divisional of application Ser. No. 11/037,005, filed on Jan. 19, 2005 now U.S. Pat. No. 7,550,237, and for which priority is claimed under 35 U.S.C. §120, the entire contents of which are hereby incorporated by reference.

BACKGROUND OF THE INVENTION

1. Field of the Invention

The invention relates to semiconductor manufacturing, especially to mask layout design.

2. Brief Discussion of the Related Art

A typical semiconductor design process includes numerous steps. A circuit designer first prepares a schematic diagram that includes logical connections between logic elements that together form an integrated circuit. The schematic diagram is then verified to determine if the logic elements and associated logical connections perform a desired function. After the circuit is verified, the schematic diagram is converted into a mask layout database that includes a series of polygons. The polygons may represent the logic elements and the logical connections contained in the schematic diagram. The mask layout database is used to generate masks, also known as reticles, that may be used for patterning different layers of the integrated circuit onto a semiconductor wafer.

Typically, the mask layout database is created manually by a layout designer or automatically by a synthesis tool. In a 0.13 micron (μm) or below manufacturing process, the layout designer or synthesis tool may use thousands of design rules to create the mask layout database. Conventionally, the design rule specifies a width/space limit for patterns in a mask layout. For example, the design rule specifies that patterns in a layout cannot be narrower than 0.13 μm. A typical mask layout, however, comprises patterns of different shapes, widths, and arrangements, such as a dense, isolated, L-shape, T-shape, line-end, or other pattern. When patterns of different characteristics are integrated into a mask layout, a reduced process window for a manufacturing process may be result. For example, a pattern comprising 0.13 μm dense line/space may have a 0.6 μm depth of focus, while a pattern comprising 0.13 μm isolated line may have a 0.3 μm depth of focus. Therefore, when patterns comprising 0.13 μm dense line/space and 0.13 μm isolated line (or isolated space) are integrated into a mask layout, a corresponding lithography process window may be narrowed down to 0.3 μm, which is too strict for mass production.

SUMMARY OF THE INVENTION

Systems for determining a width/space limit for a product mask layout are provided. An embodiment of such a system comprises a mask writer tool, lithography tool, metrology tool, and a controller. The mask writer generates a first pattern on a test mask corresponding to a test mask layout, and the lithography tool generates a second pattern on a wafer corresponding to a first pattern on a test mask by a lithography process using a preset exposure dose. The metrology tool measures widths of lines and spaces in the first and second pattern. The controller determines a width/space limit for the product mask layout for designer according to the width difference between the first and second pattern.

Also disclosed are methods of determining a width/space limit for a product mask layout. In an embodiment of such a method, a test mask corresponding to a test mask layout is provided. A standard exposure dose is determined according to wafer patterning results of the test mask using various exposure doses. A second pattern is generated on a wafer corresponding to a first pattern on a test mask by a lithography process using the standard exposure dose. Widths of lines and spaces in the test mask and second pattern are measured. A width/space limit for the product mask layout is determined according to the width difference between the first and second pattern.

BRIEF DESCRIPTION OF THE DRAWINGS

Systems and methods for determining a width/space limit for a product mask layout can be more fully understood by reading the subsequent detailed description and examples with references made to the accompanying drawings, wherein:

FIGS. 4A~4C illustrate measurements obtained from four arrays in an embodiment of a test mask and corresponding wafer.

DETAILED DESCRIPTION OF THE PREFERRED EMBODIMENTS

Several exemplary embodiments of the invention will now be described with reference to FIGS. 1 through 4, which generally relate to generating a width/space limit for a product mask layout for designer. While some embodiments of the invention operate with the wafer lithography processes, it is understood that the article patterned by the lithography processes is not critical, and other lithography processes patterning an article according to a mask layout may be readily substituted.

In the detailed description, reference is made to the accompanying drawings which form a part hereof, and in which is shown by way of illustration of specific embodiments. These embodiments are described in sufficient detail to enable those skilled in the art to practice the invention, and it is to be understood that other embodiments may be utilized and that structural, logical and electrical changes may be made without departing from the spirit and scope of the present invention. The detailed description is, therefore, not to be taken in a limiting sense. The leading digit(s) of reference numbers appearing in the Figures corresponds to the Figure number, with the exception that the same reference number is used throughout to refer to an identical component which appears in multiple Figures.

Figure 1:
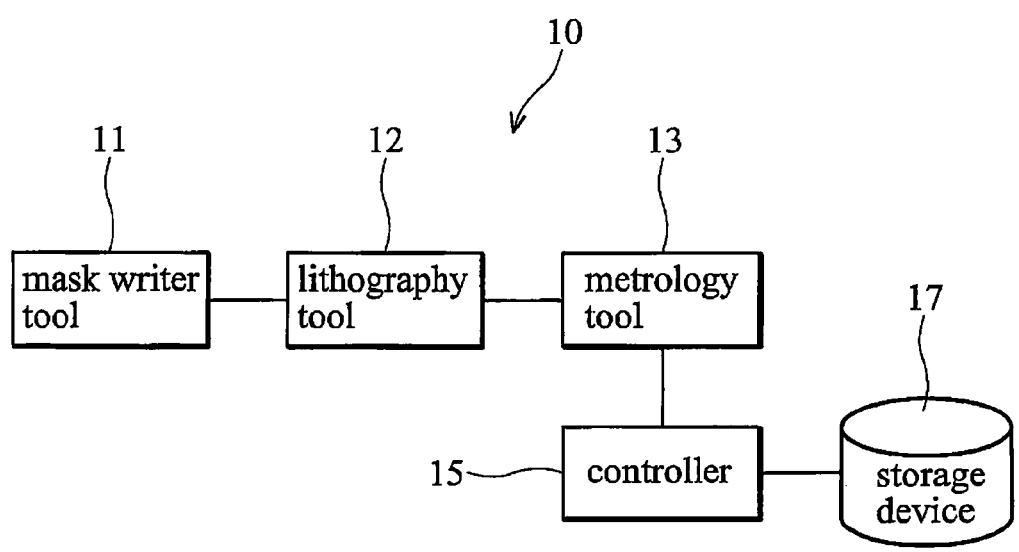
FIG. 1 is a schematic view of an embodiment of a system for generating a width/space limit for a product mask layout.

FIG. 1 is a schematic view of an embodiment of a system for generating a width/space limit for a product mask layout. Specifically, system 10 is operative to determine a width/space limit and generate a width/space limit for a product mask layout accordingly. System 10 comprises a mask writer tool 11, lithography tool 12, metrology tool 13, controller 15, and storage device 17. The mask writer 11 generates a first pattern on a test mask corresponding to a test mask layout, The lithography tool 12 generates a second pattern on a wafer corresponding to a first pattern on a test mask by a lithography process using a preset exposure dose. The metrology tool 13 measures widths of lines and spaces of the first and second pattern. The controller 15 determines a width/space limit for the product mask layout according to the difference in widths between the first and second pattern. The storage device 17 stores the corresponding width/space limit for the product mask layout for designer.

Figure 2:
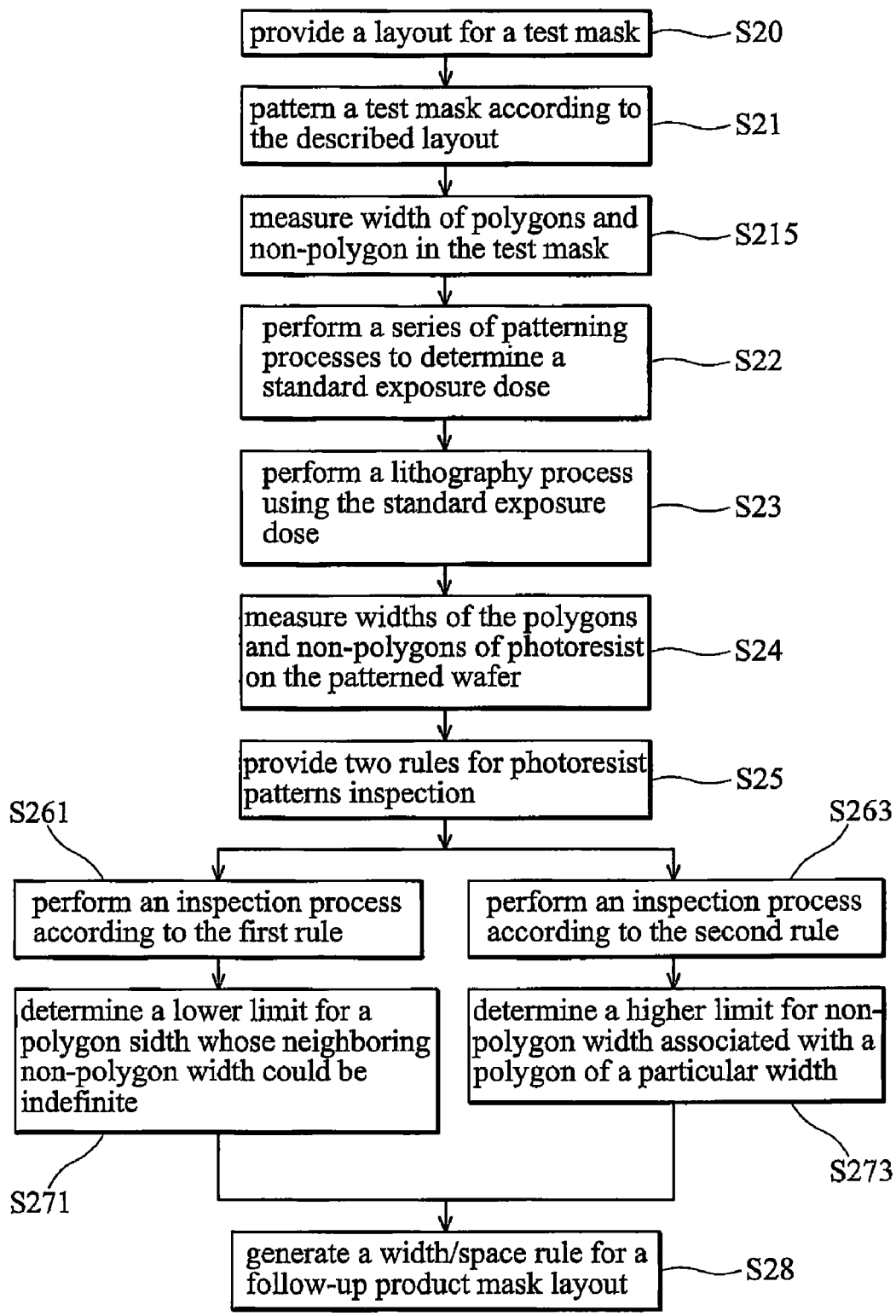
FIG. 2 is a flowchart of an embodiment of a method of determining a width/space limit for a product mask layout.

The processing steps implemented in system 10 are detailed in the flowchart of FIG. 2, and comprises determining a width/space limit for a product mask layout, broadening a common process window for a lithography process, and transferring patterns on a mask layout.

Figure 3:
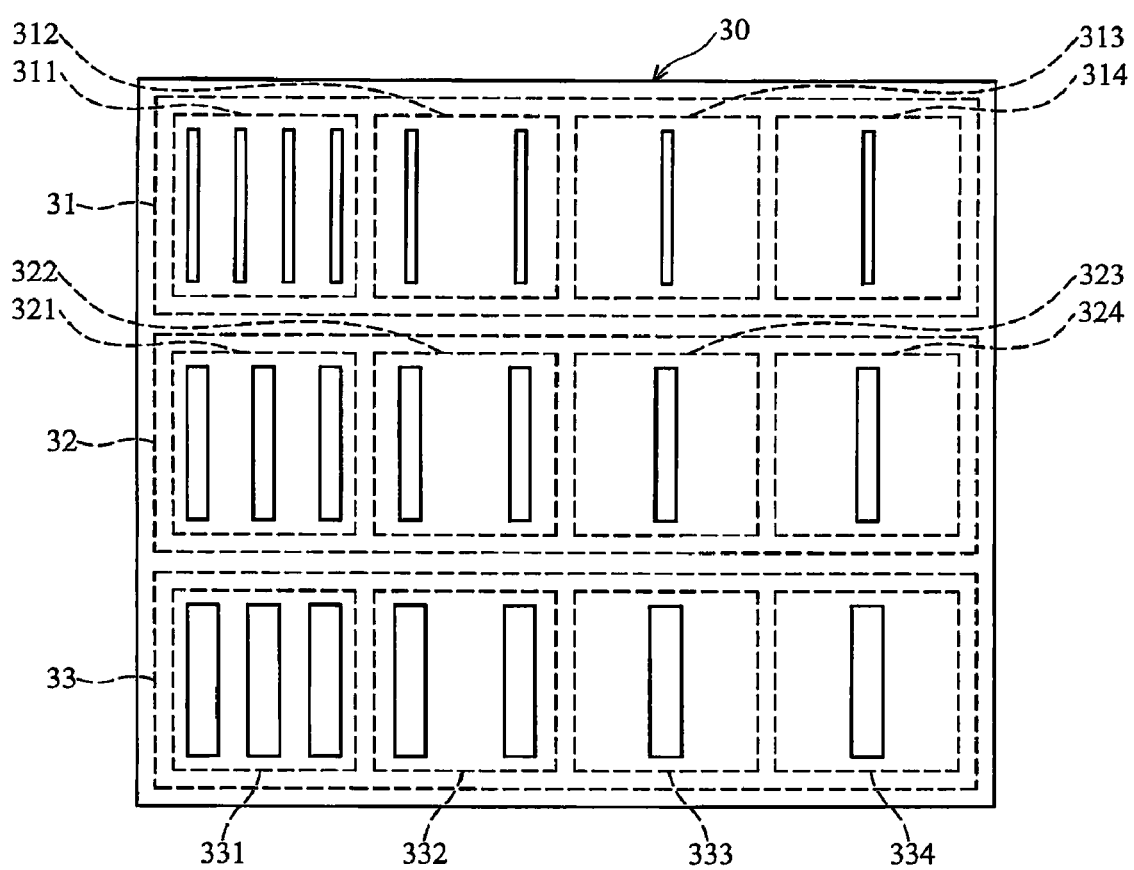
FIG. 3 is a schematic view of an embodiment of a test mask layout.

A layout for a test mask is provided (step S20). The layout of the test mask comprises a plurality of arrays, each of which comprises "polygons" (lines) of a particular width separated by "non-polygons" (spaces) of various widths. Widths of the polygons are set between 0.02 μm and 0.35 μm. Polygon widths smaller than 0.1 μm are set at intervals of 0.005 μm. Polygon widths larger than 0.1 μm are set at intervals of 0.01 μm. Referring to FIG. 3, layout 30 is used to generate a test mask, comprising arrays 31~33 for polygons of widths 0.05 μm, 0.15 μm, and 0.3 μm, respectively. These polygons are separated by non-polygons of various widths. Polygons of a particular width (say, 0.05 μm), separated by non-polygons of various widths, are arranged in an arrays.

For example, array 31 comprises polygons of 0.05 μm in width (hereinafter referred to as $L_1$) separated by non-polygons of various widths. In block 311, widths for non-polygons vary from "$L_1$" to "$L_1+0.03$ μm", which is 0.05 μm to 0.08 μm in some embodiments, at intervals of 0.005 μm. In block 312, widths for non-polygons vary from "$L_1+0.04$ μm" to "4 $L_1$", which is 0.09 μm to 0.2 μm in some embodiments, at intervals of 0.01 μm. In block 313, widths for non-polygons vary from "4 $L_1+0.02$ μm" to "8 $L_1$", which is 0.22 μm to 0.4 μm in some embodiments, at intervals of 0.02 μm. In block 314, widths for non-polygons vary from "8 $L_1+0.05$ μm" to "20 $L_1$", which is 0.45 μm to 1 μm in some embodiments, at intervals of 0.05 μm.

Similarly, array 32 comprises polygons of 0.15 μm in width (hereinafter referred to as $L_2$), separated by non-polygons of various widths. In block 321, widths for non-polygons vary from "$L_2$" to "$L_2+0.03$ μm", which is 0.15 μm to 0.18 μm, at intervals of 0.005 μm. In block 322, widths for non-polygons vary from "$L_2+0.04$ μm" to "$4L_2$", which is 0.19 μm to 0.6 μm, at intervals of 0.01 μm. In block 323, widths for non-polygons vary from "$4L_2+0.02$ μm" to "$8L_2$", which is 0.62 μm to 1.2 μm, at intervals of 0.02 μm. In block 324, widths for non-polygons vary from "$8L_2+0.05$ μm" to "$20L_2$", which is 1.25 μm to 3 μm, at intervals of 0.05 μm.

Similarly, array 33 comprises polygons of 0.3 μm in width (hereinafter referred to as $L_3$), separated by non-polygons of various widths. In block 331, widths for non-polygons vary from "$L_3$" to "$L_3+0.03$ μm", which is 0.3 μm to 0.33 μm in some embodiments, at intervals of 0.005 μm. In block 332, widths for non-polygons vary from "$L_3+0.04$ μm" to "$4L_3$", which is 0.34 μm to 1.2 μm in some embodiments, at intervals of 0.01 μm. In block 333, widths for non-polygons vary from "$4L_3+0.02$ μm" to "$8L_3$", which is 1.22 μm to 2.4 μm in some embodiments, at intervals of 0.02 μm. In block 334, widths for non-polygons vary from "$8L_3+0.05$ μm" to "$20L_3$", which is 2.45 μm to 6 μm in some embodiments, at intervals of 0.05 μm.

A test mask is generated according to the described test mask layout (step S21). Here the test mask bears a pattern identical to the described layout. In step S215, widths of the test mask is measured.

A series of patterning processes are performed to determine a standard exposure dose (step S22), wherein the standard exposure dose is used for determining a width/space limit for a product mask layout. The standard exposure dose can be determined as an exposure dose capable of generating an equal-width polygon/non-polygon pair of the second pattern from an equal-width polygon/non-polygon pair of the first pattern, wherein the equal-width polygon/non-polygon pair of the first pattern is of the smallest width of array cell of the specific layer whose mask width/space limit is to be generated. For example, a polygon and non-polygon of 0.15 μm in block 321, are used to determine the standard exposure dose of 0.15 um generation DRAM gate layer (GC), and a polygon and non-polygon of 0.05 μm in block 311, are used to determine the standard exposure dose of 0.05 um generation DRAM gate layer (GC). When the patterning process transfers the 0.05 μm polygon/non-polygon pair onto a wafer and generates a corresponding 0.05 um polygon/non-polygon pair of equal width, the exposure dose used by the patterning process is set as the standard exposure dose of this specific layer.

A lithography process is performed to transfer the pattern on the test mask onto a wafer using the standard exposure dose (step S23).

Figures 2, 4C:
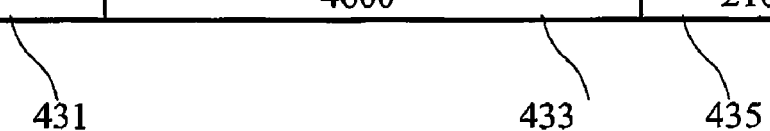

Widths of the polygons and non-polygons of photoresist on the patterned wafer are measured (step S24). The width measurement may be a through-pitch photoresist line critical width measurement. FIGS. 4A~4C illustrate measurements obtained from four different arrays. Referring to FIGS. 4A~4C, columns 401, 411, and 431 illustrate widths of polygons in arrays on a test mask, column 403, 413, and 433 illustrate widths of non-polygons corresponding to column 401, 411, and 431, and columns 405, 415, and 435 illustrate measurements of photoresist dimension (CD) on a wafer. As described, the widths of polygons and non-polygons of the test mask is the same as the layout design thereof.

In step S25, two rules are provided for photoresist patterns inspection. The first rule is used to determine a lower limit of polygon width which neighboring non-polygon width could be infinite in the product mask layout. According to the first rule, if all photoresist dimension within a particular array meet first criteria, the array of mask layout corresponding to the polygon width is considered as a "suitable array". Among the "suitable arrays", the one with the smallest width is selected, and the polygon width thereof is assigned as the lower limit for polygon width which neighboring non-polygon width could be infinite in the product mask layout. The first criteria may specify a tolerance range for difference in width between a photoresist dimension and a corresponding polygon in a test mask. For example, the first criteria specifies that the difference between a photoresist dimension and a corresponding polygon in a test mask should be lower than 15% of the polygon width in the test mask layout, and the photoresist profile is acceptable and has no defects such as photoresist bridging or photoresist collapse.

The second rule is used to determine a higher limit for a non-polygon width associated with a polygon of a particular width. According to the second rule, when the difference in widths between a photoresist dimension and a corresponding test mask polygon meet second criteria, a non-polygon adjacent to the polygon in a mask layout is considered as a "suitable non-polygon". Among a plurality of "suitable non-polygons", the one with the largest width is selected, and the non-polygon width thereof is assigned as the higher limit for a non-polygon width associated with the polygon of the particular width in the product mask layout. The second criteria may specify a tolerance range for difference in width between a photoresist dimension and a corresponding polygon in a test mask. For example, the second criteria specifies that the difference between a photoresist dimension and a corresponding polygon in a test mask should be lower than 10% of the polygon width in the test mask layout, and the photoresist profile is acceptable and has no defects such as photoresist bridging or photoresist collapse.

In step S261, an inspection process is performed according to the first rule. In step S271, a lower limit for a polygon width which neighboring non-polygon width could be infinite in the product layout mask is determined accordingly. Referring to FIG. 4C, all photoresist dimension within the array meet the described 15%-tolerance-range, thus the polygon width of test mask layout corresponding to the array, i.e. 230 nm, is assigned as the lower limit for polygon width which neighboring non-polygon width could be infinite in the product mask layout.

In step S263, an inspection process is performed according to the second rule. In step S273, a higher limit for non-polygon width associated with a polygon of a particular width is determined accordingly. Referring to FIG. 4A, for the polygon/non-polygon pair of 190 nm/240 nm, the difference between a corresponding pattern on a wafer and the original test mask is close to the described 10% tolerance range, thus the non-polygon width thereof, i.e. 240 nm, is assigned as the higher limit for a non-polygon width associated with the polygon of 190 nm in the product mask layout. Referring to FIG. 4B, for the polygon/non-polygon pair of 210 nm/310 nm, the difference between a corresponding pattern on a wafer and the original test mask layout is close to the described 10% tolerance range, thus the non-polygon width thereof, i.e. 310 nm, is assigned as the higher limit for a non-polygon width associated with the polygon of 210 nm in a mask layout.

In step S28, the width/space limits obtained in steps S271 and S273 are combined to generate a rule for the product mask layout. The rule can be applied in product mask layout design as well as in checking a provided mask layout for any potential processing bottlenecks.

A complementary layout comprising negative patterns of the described layout can be generated, and corresponding test mask can be generated and used to determine a width/space limit according to the described method.

While the invention has been described by way of example and in terms of several embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for determining a width/space limit for a product mask layout, comprising:
    a mask writer tool generating a first pattern on a test mask corresponding to a test mask layout;
    a lithography tool generating a second pattern on a wafer corresponding to a first pattern on a test mask by a lithography process using a preset exposure dose;
    a metrology tool measuring widths of the first and second pattern; and
    a controller determining a width/space limit for the product mask layout according to the width difference between the first and the second pattern.

2. The system of claim 1, wherein the test mask layout comprises a plurality of arrays, each of which comprises polygons of a particular width separated by non-polygons of various widths.

3. The system of claim 2, wherein the preset exposure dose is determined as an exposure dose capable of generating an equal-width polygon/non-polygon pair of the second pattern from an equal-width polygon/non-polygon pair of the first pattern.

4. The system of claim 3, wherein the equal-width polygon/non-polygon pair of the first pattern is of the smallest width of array cell of the specific layer whose mask width/space limit is to be generated.

5. The system of claim 3, wherein the controller further selecting a higher limit of a non-polygon width associated with a polygon of a particular width, wherein non-polygons with the selected width meet second criteria.

6. The system of claim 5, wherein the second criteria specifies a higher limit for the width difference between corresponding polygons of the first and second pattern.

7. The system of claim 2, wherein the controller further selects a polygon width of the second pattern in which all polygons of the width meet first criteria, and assigning the smallest polygon width of the selected array as the lower limit of the polygon width which neighboring non-polygon width is infinite in the product mask layout.

8. The system of claim 7, wherein the first criteria specifies a higher limit for the width difference between corresponding polygons of the first and second pattern.

9. The system of claim 1, wherein the controller further generates a product mask layout according to the width/space limit.

* * * * *